United States Patent
Chen et al.

(10) Patent No.: US 11,245,015 B2
(45) Date of Patent: Feb. 8, 2022

(54) THIN FILM TRANSISTOR, METHOD FOR PREPARING THE SAME, ARRAY SUBSTRATE, DISPLAY PANEL AND APPARATUS

(71) Applicants: Hefei Xinsheng Optoelectronics Technology Co., Ltd., Anhui (CN); BOE Technology Group Co., Ltd., Beijing (CN)

(72) Inventors: Chuan Chen, Beijing (CN); Pengyu Chen, Beijing (CN); Tao Ma, Beijing (CN); Chengshao Yang, Beijing (CN)

(73) Assignees: Hefei Xinsheng Optoelectronics Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/937,700

(22) Filed: Jul. 24, 2020

(65) Prior Publication Data
US 2021/0057531 A1    Feb. 25, 2021

(30) Foreign Application Priority Data
Aug. 22, 2019   (CN) .......................... 201910778034.6

(51) Int. Cl.
*H01L 29/417*   (2006.01)
*H01L 29/66*    (2006.01)
(Continued)

(52) U.S. Cl.
CPC .. *H01L 29/41733* (2013.01); *H01L 29/41783* (2013.01); *H01L 29/66765* (2013.01);
(Continued)

(58) Field of Classification Search
CPC ... H01L 29/04–045; H01L 29/16–1608; H01L 29/18–185; H01L 29/22–2206; H01L 29/36–365; H01L 29/4908; H01L 29/66742–6678; H01L 29/786–78696; H01L 27/12–13; H01L 27/1214; H01L 2924/13069; H01L 51/0508–057; H01L 29/41733; H01L 29/41783; H01L 29/42384; H01L 29/66765; H01L 29/78615–78618
See application file for complete search history.

(56) References Cited

U.S. PATENT DOCUMENTS 5,656,824 A * 8/1997 den Boer .......... H01L 29/66765
                                              257/225
5,877,512 A * 3/1999 Kim .................. G02F 1/136286
                                              257/57
(Continued)

*Primary Examiner* — Maliheh Malek
(74) *Attorney, Agent, or Firm* — Arent Fox LLP; Michael Fainberg

(57) ABSTRACT

The present disclosure relates to the field of display technologies, and discloses a Thin Film Transistor, a method for preparing the same, an array substrate, a display panel and an apparatus. The TFT includes: a base substrate; an active layer; a source electrode; and a drain electrode; where the active layer, the source electrode, and the drain electrode are sequentially laminated on the base substrate; and a projection of the source electrode on the base substrate covers a projection of part of edges of the active layer on the base substrate.

9 Claims, 3 Drawing Sheets

(51) Int. Cl.
*H01L 29/786* (2006.01)
*H01L 27/12* (2006.01)

(52) U.S. Cl.
CPC .. *H01L 29/78618* (2013.01); *H01L 29/78633* (2013.01); *H01L 27/1214* (2013.01)

(56) References Cited

U.S. PATENT DOCUMENTS

| | | | | |
|---|---|---|---|---|
| 6,274,884 B1* | 8/2001 | Lee | ............... | G02F 1/1368 257/57 |
| 6,906,385 B2* | 6/2005 | Moon | ............... | H01L 29/41733 257/347 |
| 7,535,027 B2* | 5/2009 | Moon | ............... | H01L 29/41733 257/184 |
| 7,687,868 B2* | 3/2010 | Chung | ............... | G02F 1/1368 257/404 |
| RE42,138 E* | 2/2011 | Lee | ............... | H01L 29/78609 257/57 |
| RE43,079 E* | 1/2012 | Lee | ............... | H01L 29/78696 257/57 |
| 8,184,226 B2* | 5/2012 | Lin | ............... | H01L 29/42384 349/48 |
| 8,610,179 B2* | 12/2013 | Moon | ............... | H01L 29/41733 257/222 |
| 8,835,929 B2* | 9/2014 | Xi | ............... | H01L 29/786 257/59 |
| 9,620,652 B2* | 4/2017 | Shen | ............... | H01L 29/78696 |
| 10,361,317 B2* | 7/2019 | Gu | ............... | G02F 1/133345 |
| 10,381,384 B2* | 8/2019 | Cheng | ............... | H01L 27/1255 |
| 10,504,940 B2* | 12/2019 | Wang | ............... | H01L 29/41733 |
| 10,586,871 B2* | 3/2020 | Lv | ............... | H01L 27/124 |
| 10,644,120 B2* | 5/2020 | He | ............... | H01L 29/42384 |
| 10,921,670 B1* | 2/2021 | Chen | ............... | G02F 1/136286 |
| 2004/0173795 A1* | 9/2004 | Moon | ............... | H01L 29/66765 257/59 |
| 2006/0049404 A1* | 3/2006 | Park | ............... | H01L 29/42384 257/59 |
| 2007/0018168 A1* | 1/2007 | Oh | ............... | G02F 1/136286 257/72 |
| 2008/0073718 A1* | 3/2008 | Lee | ............... | H01L 29/41733 257/347 |
| 2008/0316384 A1* | 12/2008 | Lee | ............... | H01L 27/124 349/39 |
| 2009/0101913 A1* | 4/2009 | Shih | ............... | H01L 29/41733 257/72 |
| 2012/0025194 A1* | 2/2012 | Kim | ............... | G06F 3/0412 257/60 |
| 2013/0207101 A1* | 8/2013 | Yamazaki | ............... | H01L 29/42384 257/43 |
| 2015/0129882 A1* | 5/2015 | Jiang | ............... | H01L 29/66742 257/72 |
| 2016/0293613 A1* | 10/2016 | Katoh | ............... | H01L 29/78678 |
| 2016/0379719 A1* | 12/2016 | Katoh | ............... | H01L 29/24 365/96 |
| 2018/0019291 A1* | 1/2018 | Morita | ............... | H01L 27/124 |
| 2018/0138281 A1* | 5/2018 | Yang | ............... | H01L 29/78633 |
| 2018/0314124 A1* | 11/2018 | Dong | ............... | G02F 1/136286 |
| 2018/0323347 A1* | 11/2018 | Liu | ............... | H01L 27/3272 |
| 2019/0189759 A1* | 6/2019 | Yong | ............... | G02F 1/1368 |
| 2020/0035835 A1* | 1/2020 | Zhou | ............... | H01L 29/7869 |
| 2020/0243660 A1* | 7/2020 | Luan | ............... | H01L 21/0274 |
| 2020/0258919 A1* | 8/2020 | Huang | ............... | H01L 29/417 |
| 2021/0074735 A1* | 3/2021 | Zhou | ............... | H01L 29/0657 |
| 2021/0083190 A1* | 3/2021 | Qu | ............... | H01L 27/3279 |
| 2021/0098724 A1* | 4/2021 | Sung | ............... | H01L 51/0529 |

* cited by examiner

THIN FILM TRANSISTOR, METHOD FOR PREPARING THE SAME, ARRAY SUBSTRATE, DISPLAY PANEL AND APPARATUS

The present application claims the priority from Chinese Patent Application No. 201910778034.6, filed with the Chinese Patent Office on Aug. 22, 2019, and entitled "Thin Film Transistor, Method for Preparing the Same, Array Substrate, Display Panel and Apparatus", which is hereby incorporated by reference in its entirety.

FIELD

The present disclosure relates to the field of display technologies, and more particularly, to a Thin Film Transistor (TFT), a method for preparing the same, an array substrate, a display panel and an apparatus.

BACKGROUND

In recent years, as the production capacity of the display panel is expanded and the consumer market grows slowly, searching new fast-growing application fields has become an urgent demand of major manufacturers. With the rapid development of the automobile market and the advent of the age of Internet of vehicles, the field of vehicle-mounted display obviously has become the third largest small and medium-sized panel application market after mobile phone and tablet markets.

SUMMARY

The present disclosure discloses a TFT, a method for preparing the same, an array substrate, a display panel and an apparatus. A TFT includes: a base substrate; an active layer; a source electrode; and a drain electrode; wherein the active layer, the source electrode, and the drain electrode are sequentially laminated on the base substrate; and a projection of the source electrode on the base substrate covers a projection of part of edges of the active layer on the base substrate.

Optionally, the source electrode coats the part of the edges of the active layer.

Optionally, the source electrode is U-shaped, and the active layer is a square shape; and the part of the edges of the active layer includes three edges; and the source electrode coats the three edges of the active layer.

Optionally, projections of two end faces of the source electrode on the base substrate partially coincide with a projection of an edge, other than the three edges, of the active layer on the base substrate.

Optionally, the source electrode is L-shaped, and the active layer is a square shape; and the part of the edges of the active layer include two edges; and the source electrode coats the two edges of the active layer.

Optionally, the drain electrode is a strip shape, and one end of the drain electrode is inserted in a region surrounded by the source electrode.

Optionally, the active layer includes a semiconductor layer and an ohmic contact layer which are sequentially laminated;

a pattern of the ohmic contact layer is similar to a pattern of the source and drain electrodes;

a channel region is formed between the source electrode and the drain electrode; and a projection of an edge of a side, facing the channel region, of the ohmic contact layer on the base substrate at least partially coincides with a projection of an edge of a side, facing the channel region, of the source and drain electrodes on the base substrate.

An array substrate includes the TFT according to any one of the above.

A display panel includes the above-mentioned array substrate.

A display apparatus includes the above-mentioned display panel.

Optionally, the display apparatus is a vehicle-mounted display apparatus.

A method for preparing a TFT includes:

forming an active layer on a base substrate;

preparing a metal layer on the active layer; and forming a pattern of source and drain electrodes by a patterning process; wherein a projection of a source electrode of the source and drain electrodes on the base substrate covers a projection of part of edges of the active layer on the base substrate.

Optionally, said forming the active layer on the base substrate includes:

preparing a semiconductor layer and an ohmic contact layer on the base substrate sequentially; and forming a pattern of the ohmic contact layer by the patterning process; wherein the pattern of the ohmic contact layer is similar to the pattern of the source and drain electrodes, a channel region is formed between the source electrode and a drain electrode of the source and drain electrodes, and a projection of an edge of a side, facing the channel region, of the ohmic contact layer on the base substrate at least partially coincides with a projection of an edge of a side, facing the channel region, of the source and drain electrodes on the base substrate.

DETAILED DESCRIPTION OF THE EMBODIMENTS

The technical solution of the embodiments of the present disclosure will be described in a clearly and completely way in conjunction with the drawings related to the embodiments of the present disclosure. It is obvious that the described embodiments are just a part but not all of the embodiments of the present disclosure. Based on the embodiments of the present disclosure, other embodiments obtained by those skilled in the art without any inventive work should fall within the scope of protection of the present disclosure.

In consideration of the working environment, a vehicle-mounted display should be able to withstand a temperature difference of minus 30 DEG C. to plus 85 DEG C.; and when the vehicle-mounted display works in a high-temperature environment for a long time, the hole capture probability of a TFT will be increased, and then the voltage threshold (Vth) of a device is reduced, resulting in that a leakage current of a data line (Data), which flows to a pixel electrode, is increased and longitudinal crosstalk occurs.

Figure 1:
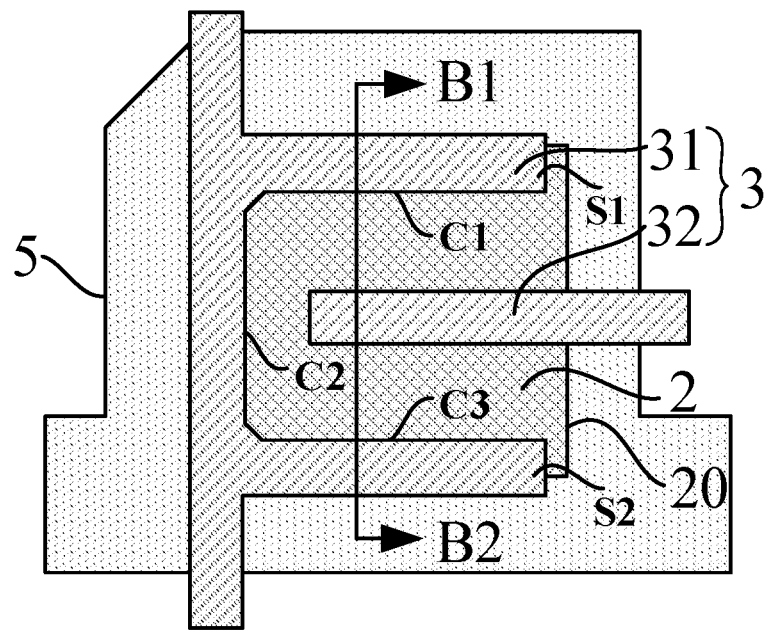
FIG. 1 is a structural schematic diagram of a TFT according to an embodiment of the present disclosure.
Figure 2:
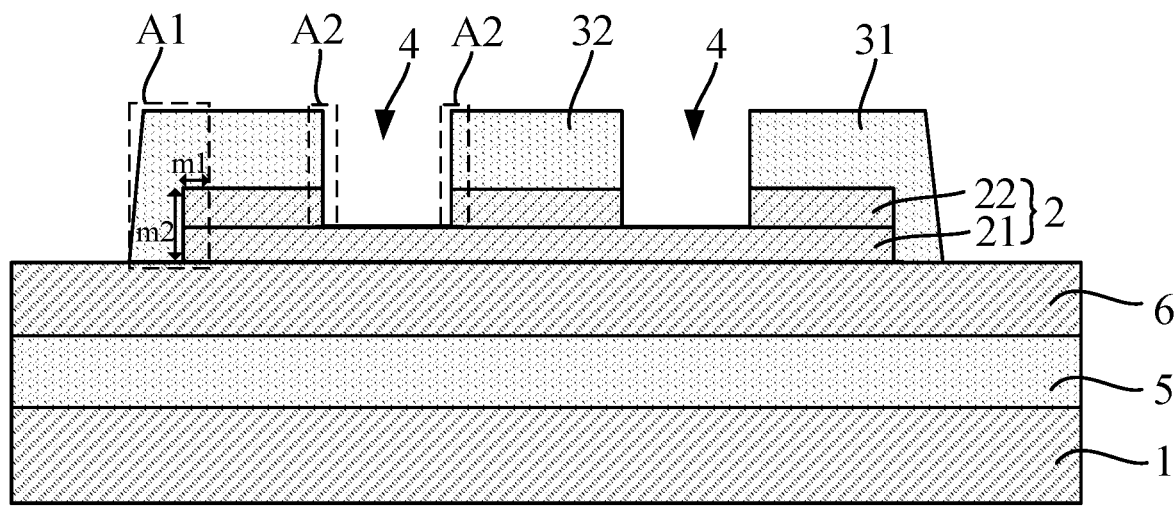
FIG. 2 is a structural schematic diagram of the TFT in FIG. 1 along a B1-B2 section.
Figure 3:
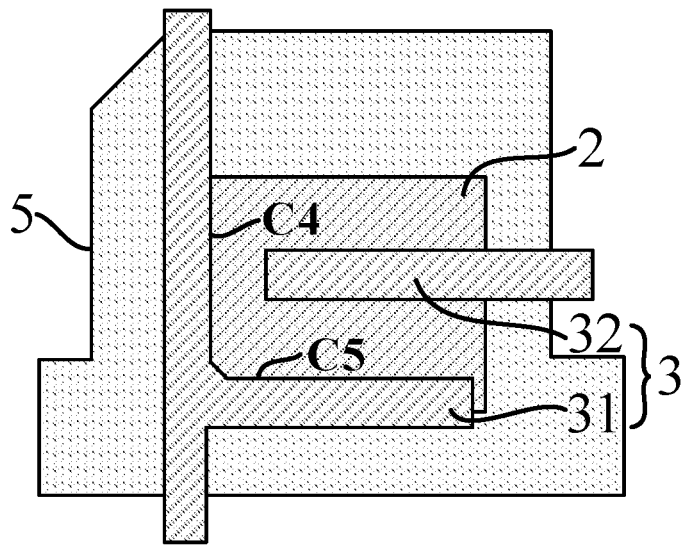
FIG. 3 is a structural schematic diagram of a TFT according to another embodiment of the present disclosure.

As shown in FIG. 1 to FIG. 3, an embodiment of the present disclosure provides a TFT, including: a base substrate 1; and an active layer 2 and source and drain electrodes 3 which are sequentially laminated on the base substrate 1; wherein a projection of a source electrode 31 of the source and drain electrodes 3 on the base substrate 1 covers a projection of part of edges of the active layer 2 on the base substrate 1, as shown in a region of a dashed box A1 in FIG. 2. Specifically, the projection of the part of the edges of the active layer 2 may be positioned within a projection pattern of the source electrode 31 (as shown in the region of the dashed box A1 in FIG. 2), and also may be aligned with an edge projection of the source electrode 31.

In the above TFT, an orthogonal projection of the source electrode 31 of source and drain metal layers overlaps with an orthogonal projection of the part of the edges of the active layer 2, i.e., the orthogonal projection of the source electrode 31 covers the orthogonal projection of the part of the edges of the active layer 2, as shown in the region of the dashed box A1 in FIG. 2, which enables a light receiving area of the active layer 2 to be reduced, so that generation of holes can be effectively reduced and concentration of photon-generated carriers under the light condition can be reduced, and thus, defect states of increase of a hole capture probability, reduction of a voltage threshold and the like of the TFT working in a high-temperature light environment can be avoided, and performances of a TFT device in the high-temperature light environment are improved. Therefore, when the above TFT is applied to a display panel, working performances of a display product in the high-temperature environment can be improved, and reliability of the display product can be enhanced.

Specifically, when the TFT is applied to a display apparatus, the light received by the active layer generally is from backlight inside the display apparatus, emitted light of an organic light-emitting unit, refracted light generated when external light enters the inside of the display apparatus and the like.

As shown in FIG. 2, in a specific embodiment, in the present disclosure, the source electrode 31 of the TFT can directly coat the part of the edges, whose projection overlaps with the projection of the source electrode 31, of the active layer 2, as shown in the region of the dashed box A1 in FIG. 2, and 'coating the edges' refers to coating all the upper surfaces and the side surfaces adjacent to the edges, such as the upper surfaces m1 and the side surfaces m2, so that the light receiving area of the active layer 2 can be reduced to the greatest extent.

In some embodiments, as shown in FIG. 1, the source electrode 31 is U-shaped, the active layer 2 is a square shape, the source electrode 31 overlaps with three edges (such as edges C1, C2 and C3) of the active layer 2, the source electrode 31 coats the three edges of the active layer 2, a drain electrode 32 is a strip shape, and one end of the drain electrode is inserted into a region surrounded by a U-shaped structure of the source electrode 31. By the setting above, three outside edges of the active layer 2 are covered by the metal of the source electrode 31, so that the light receiving area of the active layer 2 is reduced, and thus, the performances of the TFT device in the high-temperature light environment can be effectively improved.

In some embodiments, projections of end faces (such as end faces S1 and S2 as shown in FIG. 1) of both ends of the source electrode 31 on the base substrate 1 partially coincide with a projection of a fourth edge 20, other than the above three edges, of the active layer 2 on the base substrate 1. It should be noted that for a case that 'the projections coincide' involved in the embodiment of the present disclosure, certain errors are allowed in the actual production process. For example, as shown in FIG. 1, the active layer 2 is positioned on the lower layer, and in the actual production process, the fourth edge of the active layer 2 may slightly go beyond two end faces of the source electrode 31.

In some embodiments, as shown in FIG. 3, the source electrode 31 is L-shaped, the active layer 2 is a square shape, the source electrode 31 overlaps with two edges (such as edges C4 and C5) of the active layer 2, the source electrode 31 coats the two edges of the active layer, the drain electrode 32 is a strip shape, and one end of the drain electrode is inserted into a region surrounded by an L-shaped structure of the source electrode 31. By the setting above, two outside edges of the active layer 2 are covered by the metal of the source electrode 31, so that the light receiving area of the active layer 2 is reduced, and thus, the performances of the TFT device in the high-temperature light environment can be effectively improved.

As shown in FIG. 2, in a specific embodiment, in the present disclosure, the active layer 2 may include a semiconductor layer 21 and an ohmic contact layer 22 which are sequentially laminated; and a pattern of the ohmic contact layer 22 is similar to a pattern of the source and drain electrodes 3; a channel region 4 is formed between the source electrode 31 and the drain electrode 32 of the source and drain electrodes 3, and correspondingly, the ohmic contact layer 22 has a hollowed-out region corresponding to the channel region 4; and specifically, a projection of an edge of a side (the inner side), facing the channel region 4, of the ohmic contact layer 22 on the base substrate 1 at least partially coincides with a projection of an edge of a side, facing the channel region 4 (the hollowed-out region on the inner side), of the source and drain electrodes 3 on the base substrate 1, as shown in a region of a dashed box A2 in FIG. 2. It should be noted that for a case that 'the projections coincide' involved in the embodiment of the present disclosure, certain errors are allowed in the actual production process. For example, the ohmic contact layer 22 is positioned on the lower layer, and in the actual production process, the inside edge of the ohmic contact layer 22 may slightly go beyond the inside edge of the source and drain electrodes 3.

According to the TFT provided by the embodiments of the present disclosure, the edge, positioned in the channel region 4, of the ohmic contact layer 22 in the active layer 2 at least partially coincides with the edges, positioned in the channel region 4, of the source and drain electrodes 3, as shown in the region of the dashed box A2 in FIG. 2, i.e., an area of a tail of the ohmic contact layer 22 in the channel region 4 is reduced, and a light receiving area of the ohmic contact layer 22 is reduced, so that the defect states of increase of the hole capture probability, reduction of the voltage threshold and the like of the TFT working in the high-temperature light environment can be further avoided, and the performances of the TFT device in the high-temperature light environment are improved.

Specifically, the ohmic contact layer 22 can be obtained by carrying out doping on a semiconductor.

Further, as shown in FIG. 1 to FIG. 3, the TFT according to the embodiments of the present disclosure further includes conventional structures, such as a gate layer 5, a gate insulating layer 6 and the like, which are not repeated herein.

Figure 4:
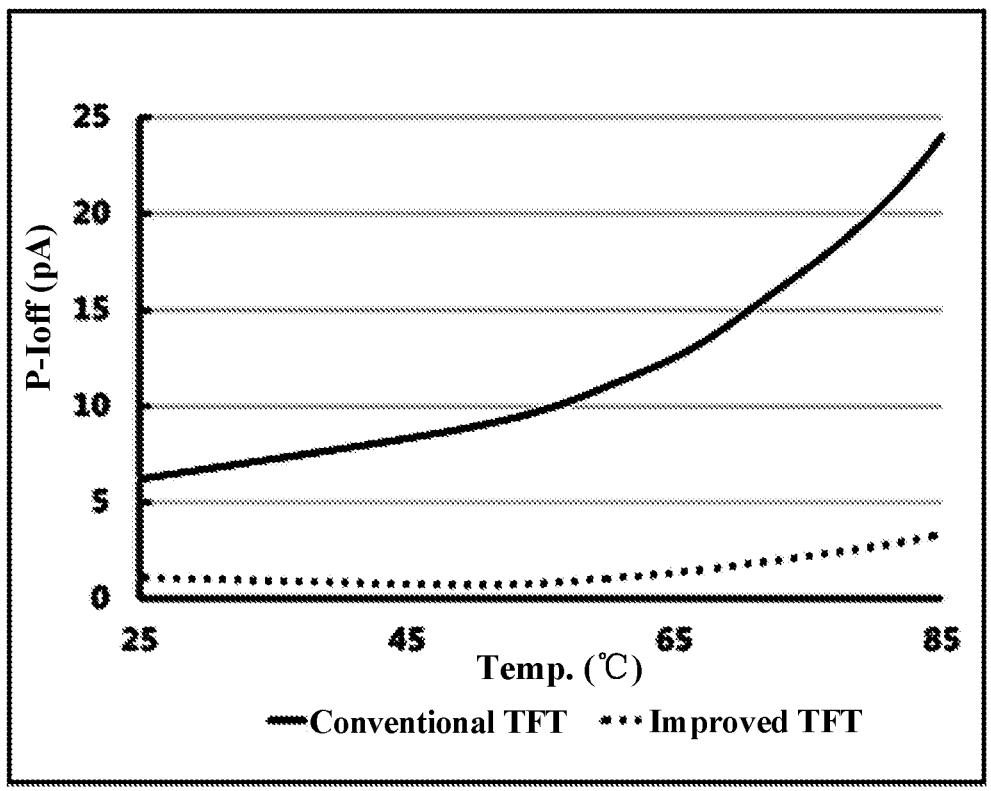
FIG. 4 is a schematic diagram of comparison between variation curves of off-state currents (P-Ioff) of a conventional TFT and the improved TFT according to the embodiment of the present disclosure under the light condition with temperature.

Specifically, according to the present disclosure, performance testing is further carried out on the TFT provided by the above-mentioned embodiments, specifically, in the present disclosure, respective variation situations of off-state currents (P-Ioff) of a conventional TFT and the improved TFT according to the embodiments of the present disclosure under the light condition with temperature are tested, and a schematic diagram of comparison between the variation curves of the off-state currents (P-Ioff) of the TFTs under the light condition with the temperature, as shown in FIG. 4, is obtained; and as shown in FIG. 4, by comparing the situations of two curves in FIG. 4, it can be seen that compared to the off-state current of the conventional TFT in the prior art, the off-state current (P-Ioff) of the improved TFT according to the embodiments of the present disclosure under the light condition is greatly reduced, the variation of the off-state current (P-Ioff) of the improved TFT according to the embodiments of the present disclosure under the light condition with the temperature is very small, the off-state current (P-Ioff) is only about 2 pA at a high temperature of 65 DEG C., and the off-state current (P-Ioff) also cannot reach 4 pA even at a high temperature of 85 DEG C., and thus, the performances are very good and a problem of crosstalk of the display panel, which is caused by the defect states in the high-temperature environment, can be effectively avoided. For the conventional TFT in the prior art, the off-state current (P-Ioff) reaches about 6 pA under the normal temperature condition of 25 DEG C., and the off-state current (P-Ioff) even will reach about 20 pA at a high temperature of 80 DEG C., which is liable to result in that the display panel has longitudinal crosstalk and cannot normally work.

An embodiment of the present disclosure further provides an array substrate, and the array substrate includes the TFT according to any one of the above. Specifically, the array substrate is provided with a plurality of TFTs arranged in an array, and each TFT is used for controlling a display switch of a corresponding pixel.

An embodiment of the present disclosure further provides a display panel, and the display panel includes the above-mentioned array substrate.

An embodiment of the present disclosure further provides a display apparatus, and the display apparatus includes the above-mentioned display panel.

In some embodiments, the display apparatus according to the embodiment of the present disclosure may be a vehicle-mounted display apparatus. Certainly, the display apparatus also may be one of other display products in the high-temperature working environment.

In the display apparatus according to the present disclosure, by changing designs of the active layer (silicon island) and the source and drain electrodes in the TFT (TFT switch), problems of increase of the defect states and generation of longitudinal crosstalk after the display apparatus works in the high-temperature environment for a long time are solved, the characteristic ability of the product is enhanced, and the service life of the product is prolonged.

Figure 5:
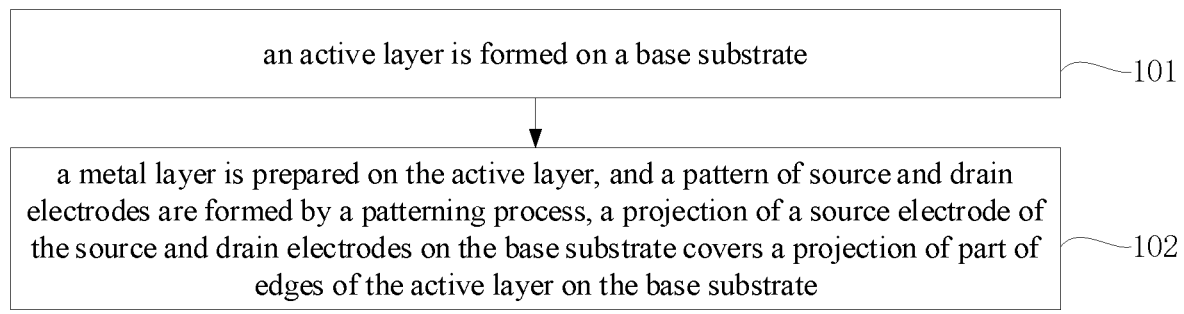
FIG. 5 is a flow chart of a method for preparing a TFT according to an embodiment of the present disclosure.

In addition, based on the TFT according to the embodiments of the present disclosure, an embodiment of the present disclosure further provides a method for preparing a TFT. As shown in FIG. 5, the method includes the following steps of:

S101: an active layer is formed on a base substrate.

S102: a metal layer is prepared on the active layer, and a pattern of source and drain electrodes are formed by a patterning process, a projection of a source electrode of the source and drain electrodes on the base substrate covers a projection of part of edges of the active layer on the base substrate.

According to the TFT prepared by the above-mentioned preparation method, an orthogonal projection of the source electrode of source and drain metal layers overlaps with an orthogonal projection of part of the edges of the active layer, i.e., the orthogonal projection of the source electrode covers the orthogonal projection of the part of the edges of the active layer, which enables a light receiving area of the active layer to be reduced, so that generation of the holes can be effectively reduced and the concentration of the photon-generated carriers under the light condition can be reduced, and thus, the defect states of increase of the hole capture probability, reduction of the voltage threshold and the like of the TFT working in the high-temperature light environment can be avoided, and the performances of the TFT device in the high-temperature light environment are improved. When the above TFT is applied to the display panel, the working performances of the display product in the high-temperature environment can be improved, and reliability of the display product can be enhanced.

In some embodiments, in the step S101, the design of an active mask can be changed to properly reduce an area of the active layer (silicon island) of a display region (AA region) in the display panel, so that the projection of the source electrode can cover the edge of the active layer, thereby fulfilling the aim of reducing the light area of the active layer.

In some embodiments, in the step S102, the source and drain electrode layers can be matched with the active layer (Active) by changing an SD mask, so that the pattern of the source electrode can lap with and cover the edge of the active layer (silicon island).

In some embodiments, the step S101 that the active layer is formed on the base substrate specifically includes:

S201: a semiconductor layer and an ohmic contact layer are sequentially prepared on the base substrate. Specifically, the ohmic contact layer may be obtained by carrying out doping on a semiconductor.

S202: a pattern of the ohmic contact layer is formed by the patterning process; wherein the pattern of the ohmic contact layer is similar to the pattern of the source and drain electrodes, a channel region is formed between the source electrode and a drain electrode of the source and drain electrodes, and a projection of an edge of a side, facing the channel region, of the ohmic contact layer on the base substrate at least partially coincides with a projection of an edge of a side, facing the channel region, of the source and drain electrodes on the base substrate.

According to the TFT provided by the embodiments of the present disclosure, the edge, positioned in the channel region, of the ohmic contact layer in the active layer at least partially coincides with the edges, positioned in the channel region, of the source and drain electrodes, i.e., an area of a tail of the ohmic contact layer in the channel region is reduced, and a light receiving area of the ohmic contact layer is reduced, so that the defect states of increase of the hole capture probability, reduction of the voltage threshold and the like of the TFT working in the high-temperature light environment can be further avoided, and the performances of the TFT device in the high-temperature light environment are improved.

In some embodiments, before the step S101, the preparation method according to the embodiment of the present disclosure further includes steps of preparing a gate metal layer and a gate insulating layer and the like, and those steps are the same as the preparation flow of the conventional TFT and are not repeated herein.

It is evident that those skilled in the art can make various changes or modifications to the embodiments of the present disclosure without departure from the spirit and scope of the present disclosure. Thus, if these changes or modifications to the present disclosure are within the scope of the claims of the present disclosure and equivalent technologies, the present disclosure also intends to include all such changes or modifications within its scope.

What is claimed is:

1. A Thin Film Transistor (TFT), comprising:
    a base substrate;
    an active layer;
    a source electrode; and
    a drain electrode;
    wherein the active layer, the source electrode, and the drain electrode are sequentially laminated on the base substrate; and
    a projection of the source electrode on the base substrate covers a projection of part of edges of the active layer on the base substrate;
    wherein the source electrode coats the part of the edges of the active layer;
    wherein the source electrode is U-shaped, the active layer is a square shape, the part of the edges of the active layer comprises three edges, and the source electrode coats the three edges of the active layer; wherein projections of two end faces of the source electrode on the base substrate partially coincide with a projection of an edge, other than the three edges, of the active layer on the base substrate; or
    the source electrode is L-shaped, the active layer is a square shape, the part of the edges of the active layer comprises two edges, the source electrode coats the two edges of the active layer, and the two edges of the active layer are adjacent.

2. The TFT according to claim 1, wherein the drain electrode is a strip shape, and one end of the drain electrode is inserted in a region surrounded by the source electrode.

3. The TFT according to claim 1, wherein the active layer comprises a semiconductor layer and an ohmic contact layer which are sequentially laminated;
    a pattern of the ohmic contact layer is similar to a pattern of the source and drain electrodes;
    a channel region is formed between the source electrode and the drain electrode; and
    a projection of an edge of a side, facing the channel region, of the ohmic contact layer on the base substrate at least partially coincides with a projection of an edge of a side, facing the channel region, of the source and drain electrodes on the base substrate.

4. An array substrate, comprising the TFT according to claim 1.

5. A display panel, comprising the array substrate according to claim 4.

6. A display apparatus, comprising the display panel according to claim 5.

7. The display apparatus according to claim 6, wherein the display apparatus is a vehicle-mounted display apparatus.

8. A method for preparing the TFT according to claim 1, comprising:
    forming the active layer on a base substrate;
    preparing a metal layer on the active layer; and
    forming a pattern of source and drain electrodes by a patterning process.

9. The method according to claim 8, wherein the forming the active layer on the base substrate comprises:
    preparing a semiconductor layer and an ohmic contact layer on the base substrate sequentially; and
    forming a pattern of the ohmic contact layer by the patterning process;
    wherein the pattern of the ohmic contact layer is similar to the pattern of the source and drain electrodes,
    a channel region is formed between the source electrode and the drain electrode of the source and drain electrodes, and
    a projection of an edge of a side, facing the channel region, of the ohmic contact layer on the base substrate at least partially coincides with a projection of an edge of a side, facing the channel region, of the source and drain electrodes on the base substrate.

* * * * *